United States Patent
Yoshioka

(10) Patent No.: US 7,969,336 B2
(45) Date of Patent: Jun. 28, 2011

(54) SAMPLE-HOLD CIRCUIT HAVING SPREADING SWITCH AND ANALOG-DIGITAL CONVERTER USING SAME

(75) Inventor: Masato Yoshioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 12/556,739

(22) Filed: Sep. 10, 2009

(65) Prior Publication Data
US 2010/0026536 A1  Feb. 4, 2010

Related U.S. Application Data

(63) Continuation of application No. PCT/JP2007/000243, filed on Mar. 16, 2007.

(51) Int. Cl.
*H03M 1/10* (2006.01)

(52) U.S. Cl. ............................ 341/122; 341/155; 327/91

(58) Field of Classification Search .................. 341/118, 341/120, 122, 123, 143, 155; 327/91–96
See application file for complete search history.

(56) References Cited

U.S. PATENT DOCUMENTS

| | | | |
|---|---|---|---|
| 4,912,423 A * | 3/1990 | Milkovic et al. .................. 330/9 |
| 6,201,835 B1 * | 3/2001 | Wang ............................. 341/143 |
| 7,088,147 B2 * | 8/2006 | Prasad et al. ..................... 327/91 |
| 7,239,183 B2 * | 7/2007 | Ruha et al. ....................... 327/95 |
| 7,545,296 B2 * | 6/2009 | Bult et al. ...................... 341/122 |

OTHER PUBLICATIONS

Jamal, S.M., et al. "A 10-b 120-Msample/s Time-Interleaved Analog-to-Digital Converter with Digital Background Calibration," IEEE Journal of Solid-State Circuits, Dec. 2002, pp. 1618-1627, vol. 37, Issue. 12, Fig. 10.

Van Der Ploeg, Hendrik, et al. "A 2.5-V 12-b 54-Msample/s 0.25-μm CMOS ADC in 1-mm$^2$ With Mixed-Signal Chopping and Calibration," IEEE Journal of Solid-State Circuits, Dec. 2001, pp. 1859-1867, vol. 36, Issue. 12.

* cited by examiner

*Primary Examiner* — Howard Williams
(74) *Attorney, Agent, or Firm* — Arent Fox LLP

(57) ABSTRACT

A sample-hold circuit includes a voltage-current converter, having a first input terminal pair to which an input differential signal is input and a first output terminal pair which outputs current according to the voltage of the input differential signal, a spreading switch having a switch group which switches the first output terminal pair to inverting or non-inverting states, and an integrator having a second input terminal pair coupled to the first output terminal pair via the spreading switch, an output amplifier which outputs to a second output terminal pair an output differential signal amplified according to the differential signal at the second input terminal pair, a capacitor pair which is provided respectively between the second input terminal pair and second output terminal pair, and which is charged or discharged by current input to the second input terminal pair, and a reset circuit which resets charge states of the capacitor pair.

12 Claims, 15 Drawing Sheets

$$\Delta V_O = RN \cdot \Delta V_I - V_{off} + V_N$$

SAMPLE-HOLD CIRCUIT HAVING SPREADING SWITCH AND ANALOG-DIGITAL CONVERTER USING SAME

CROSS REFERENCE TO RELATED APPLICATIONS

This application is a continuation of International Application No. PCT/JP2007/000243, filed on Mar. 16, 2007, now pending, herein incorporated by reference.

FIELD

This application relates to a sample-hold circuit having a spreading switch, and relates to a sample-hold circuit in which output signal distortion due to the spreading switch is suppressed, and to an analog-digital converter using such a circuit.

BACKGROUND

Low power consumption, fast operation, and high precision are required of analog-digital converters (hereafter ADCs). In order to achieve fast operation with low power consumption, a time interleave design is advantageous, in which a plurality of (M) ADC units are arranged in parallel, and the plurality of ADC units perform time-division conversion, in order, of input analog signals into digital signals. In such an ADC with a time-interleave design, the sampling frequency of each ADC unit is, relative to the sampling frequency f of the ADC, reduced to the frequency f·M, and power consumption may be reduced, while the overall sampling frequency may be raised.

On the other hand, in the case of a time interleave ADC, there is the problem that mismatches between characteristics of the plurality of ADC units arranged in parallel may cause unwanted waves or errors (spurious components), so that the AD conversion characteristic is degraded. Mismatches in the characteristics of ADC units include the offset (shift between input and output) and shifts in the gain (slope of the output relative to the input) of the ADC units, and may also include shifts in the timing of switching of the plurality of ADC units. Hence mismatches between the characteristics of the plurality of ADC units are suppressed.

Vigorous development efforts are in progress to correct offset errors and gain errors among such mismatches in characteristics. As one such effort, digital background correction has been proposed, as described for example in Non-patent References 1 and 2.

In particular, in Non-patent Reference 2, the above-described time interleave type ADC is described. And, in Non-patent Reference 2, a configuration for digital background correction of offset errors is described in which an input analog signal is multiplied by a pseudorandom binary signal to perform spreading; the offset component of DC component is removed from this AD-converted signal, which is again multiplied by a pseudorandom binary signal to perform despreading. By means of this configuration, offset components in each of the ADC units are removed, so that such a configuration is suitable for time interleave designs.

Non-patent Reference 1: "A 2.5 V 12 b 54M sample-s 0.25 μm ADC in 1-mm2 with Mixed-Signal Chopping and Calibration", Hendrik van der Ploeg, IEEE Journal of Solid-State Circuits, Vol. 36, No. 12, December 2001.

Non-patent Reference 2: "A 10 b 120M sample-s Time-Interleaved Analog-to-Digital Converter with Digital Background Calibration", Shafiq M. Jamal, IEEE Journal of Solid-State Circuits, Vol. 37, No. 12, December 2002.

In the configuration described in Non-patent Reference 2 above in which digital background correction of offset errors is performed, a spreader to multiply the input analog signals by pseudorandom binary signals is necessary. This spreader normally is realized by a plurality of transistor switches; but the existence of transistor switches has the harmful effect of causing distortion of analog signals. That is, because the turn-on resistance of transistor switches fluctuates with the input analog signal level, distortion occurs in the analog signals output from switches.

SUMMARY

According to an aspect of the embodiment, a sample-hold circuit includes a voltage-current converter, having a first input terminal pair to which an input differential signal is input and a first output terminal pair which outputs current according to the voltage of the input differential signal, a spreading switch having a switch group which switches the first output terminal pair to inverting or non-inverting states, and an integrator having a second input terminal pair coupled to the first output terminal pair via the spreading switch, an output amplifier which outputs to a second output terminal pair an output differential signal amplified according to the differential signal at the second input terminal pair, a capacitor pair which is provided respectively between the second input terminal pair and second output terminal pair, and which is charged or discharged by current input to the second input terminal pair, and a reset circuit which resets charge states of the capacitor pair.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Figure 1A:
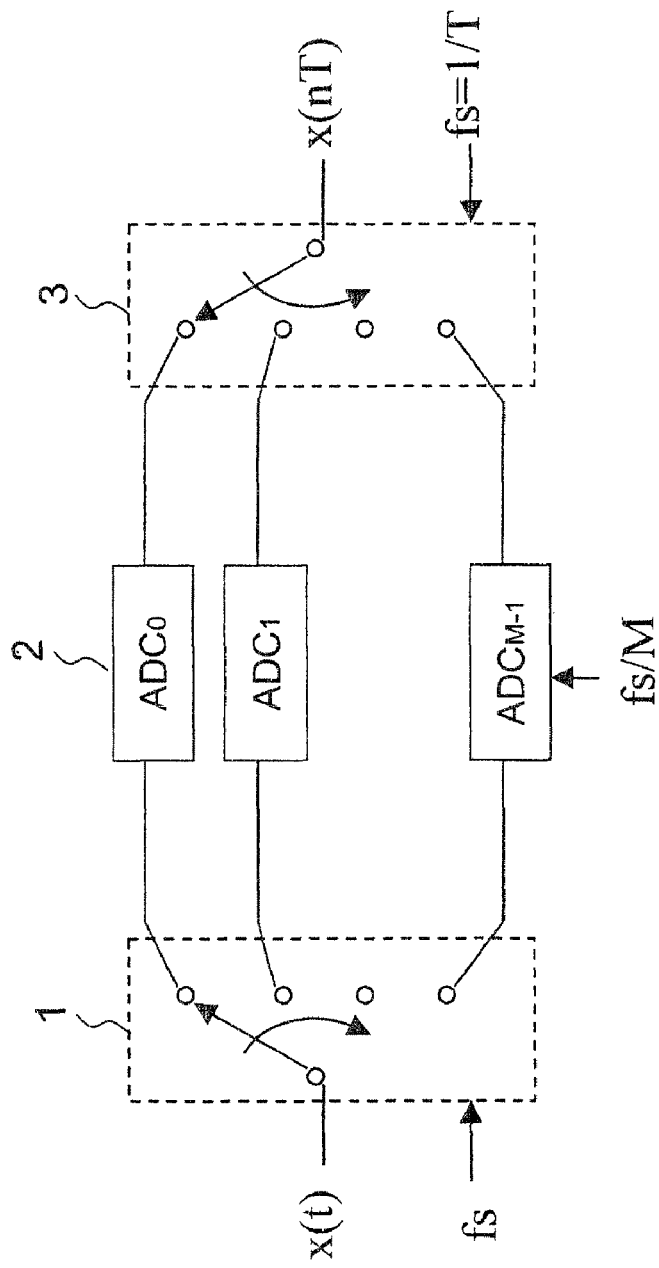
FIG. 1 is a drawing depicting the configuration of a time-interleave ADC and a frequency spectrum.

Below, embodiments are explained referring to the drawings. However, the technical scope of the invention is not limited to these aspects, but extends to the inventions described in the Scope of Claims and to inventions equivalent thereto.

FIG. 1 depicts the configuration of a time-interleave ADC and a frequency spectrum. The ADC in FIG. 1A performs AD conversion of analog input signals x(t) and outputs the digital output signals x(nT). This ADC has an analog demultiplexer 1, which performs demultiplexing of analog input signals x(t) in synchronization with a sampling frequency fs; an ADC unit group 2, having a plurality of ADC units which convert the demultiplexed analog input signals x(t) into digital output signals x(nT); and a digital multiplexer 3, which performs multiplexing of the digital output signals x(nT) output from the plurality of ADC units in synchronization with the sampling frequency fs. Each of the ADC units converts the analog input signals into digital output signals in synchronization with the unit sampling frequency fs-M, obtained by dividing the sampling frequency fs by the number of ADC units M.

Through time-division operation of the plurality of ADC units, each ADC unit sample the analog input signals x(t) in synchronization with the unit sampling frequency fs-M, which is slower than the ADC sampling frequency fs, and convert the signals into digital output signals. In general, as the speed of operation of an ADC circuit rises, the power consumption rises rapidly. Hence by adopting a time-interleaving ADC design, low power consumption and fast operation may be realized.

A problem with time-interleaving ADCs is the elimination of spurious components (unwanted waves, errors) due to mismatching of the characteristics of the plurality of ADC units provided in parallel. The characteristics of ADC units include the offset, corresponding to the output value when the input is zero, and the gain, corresponding to the slope of the output relative to the input; in addition, in a time-interleaving ADC, skew occurs due to shifts in the switch timing of the demultiplexer 1 and multiplexer 3.

Figure 1B:
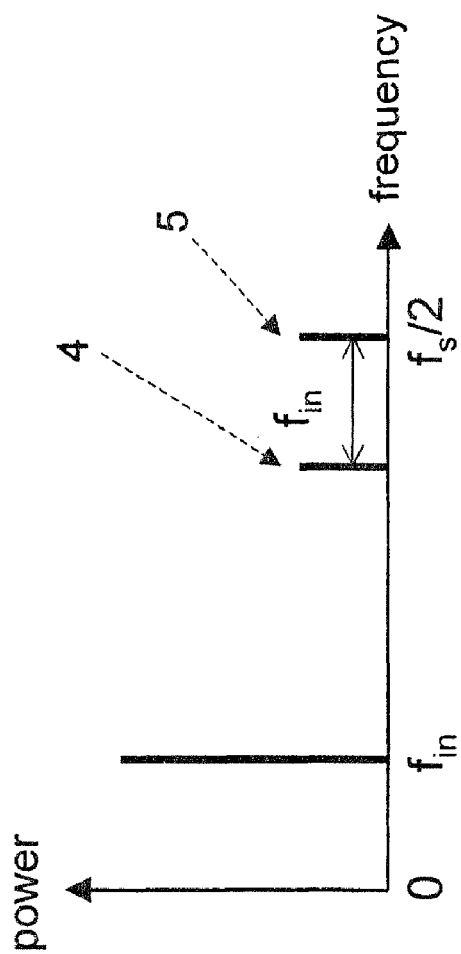

FIG. 1B depicts the frequency spectrum obtained by a Fourier transform of the digital output signal x(nT) in FIG. 1A. The horizontal axis indicates the frequency, and the vertical axis corresponds to the signal intensity. As depicted in FIG. 1B, the power is of course high at the input signal frequency fin, but there also exist a spurious component 4 due to gain mismatches and skew, and a spurious component 5 due to offset mismatches. In the figure, fs-2 is the Nyquist frequency. Hence these spurious components 4, 5 are removed.

Figure 2:
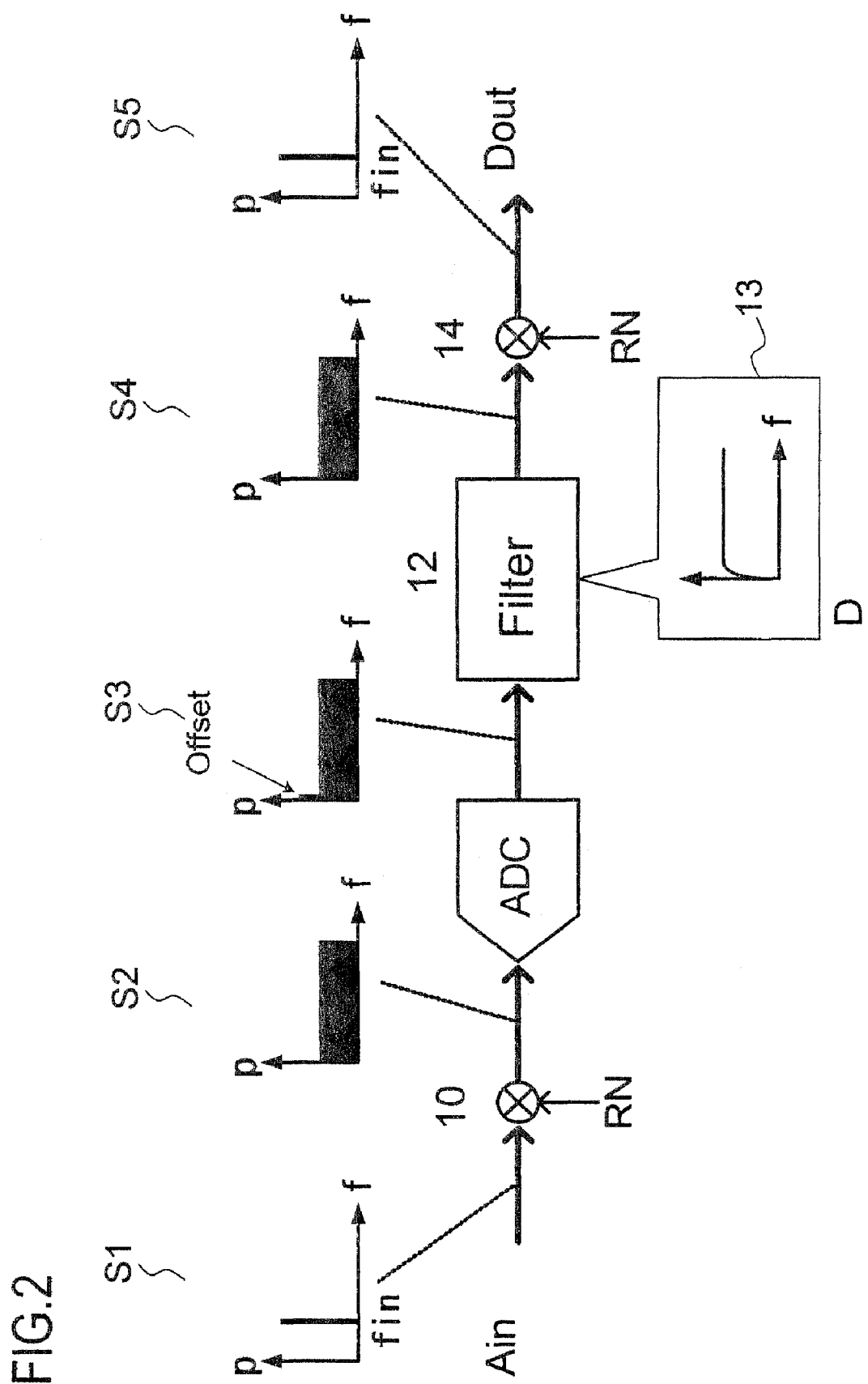
FIG. 2 is a drawing depicting the configuration of an ADC which performs digital background correction of offset errors, and depicts the frequency spectra of signals.

FIG. 2 depicts the configuration of an ADC which performs digital background correction of offset errors, and depicts the frequency spectra of signals. This correction method is similar to that described in the above Non-patent Reference 2.

The analog input signals Ain are depicted as the frequency spectra S1 obtained by Fourier transform thereof, and have power only at a specific input frequency fin. A spreading unit 10 comprising a multiplier multiplies the analog input signals Ain by pseudorandom number signals RN to perform spectrum spreading, and the ADC converts the spread-spectrum analog input signals into digital signals. The random numbers RN are random numbers generated by a pseudorandom number generator circuit or similar, and are M series signals comprising random repetitions of +1, −1; over a long period, the average value of the signal series is zero. By this means, the analog input signals which have been spectrum-spread by the random numbers RN no longer have the fin frequency characteristic, as indicated by the frequency spectrum S2, but have constant power over the entire range of frequencies f. Further, the AD-converted digital signals have the ADC offset component added as a spurious component, and so as indicated by the frequency spectrum S3 obtained by discrete Fourier transform of this, a DC component corresponding to the offset component is added. That is, through spectrum-spreading of the analog input signals Ain, the offset component superposed thereupon may be clearly distinguished as a DC component.

The digital filter 12 has characteristics which remove only the DC component, as indicated by the filter characteristics 13, so that the DC component corresponding to the offset component is removed from the digital signal output from the ADC. That is, the output of the filter 12 has the DC component removed, as indicated by the frequency spectrum S4. Finally, the despreading unit 14 comprising a multiplier multiplies the output of the filter 12 by the same random number signal RN as on the input side to perform despreading, to generate a digital output signal Dout having the same frequency spectrum S5 as the analog input signal Ain. This despreading unit 14 merely reverses the bits of the digital output signal of the filter 12 based on the random number signal RN.

Figure 3:
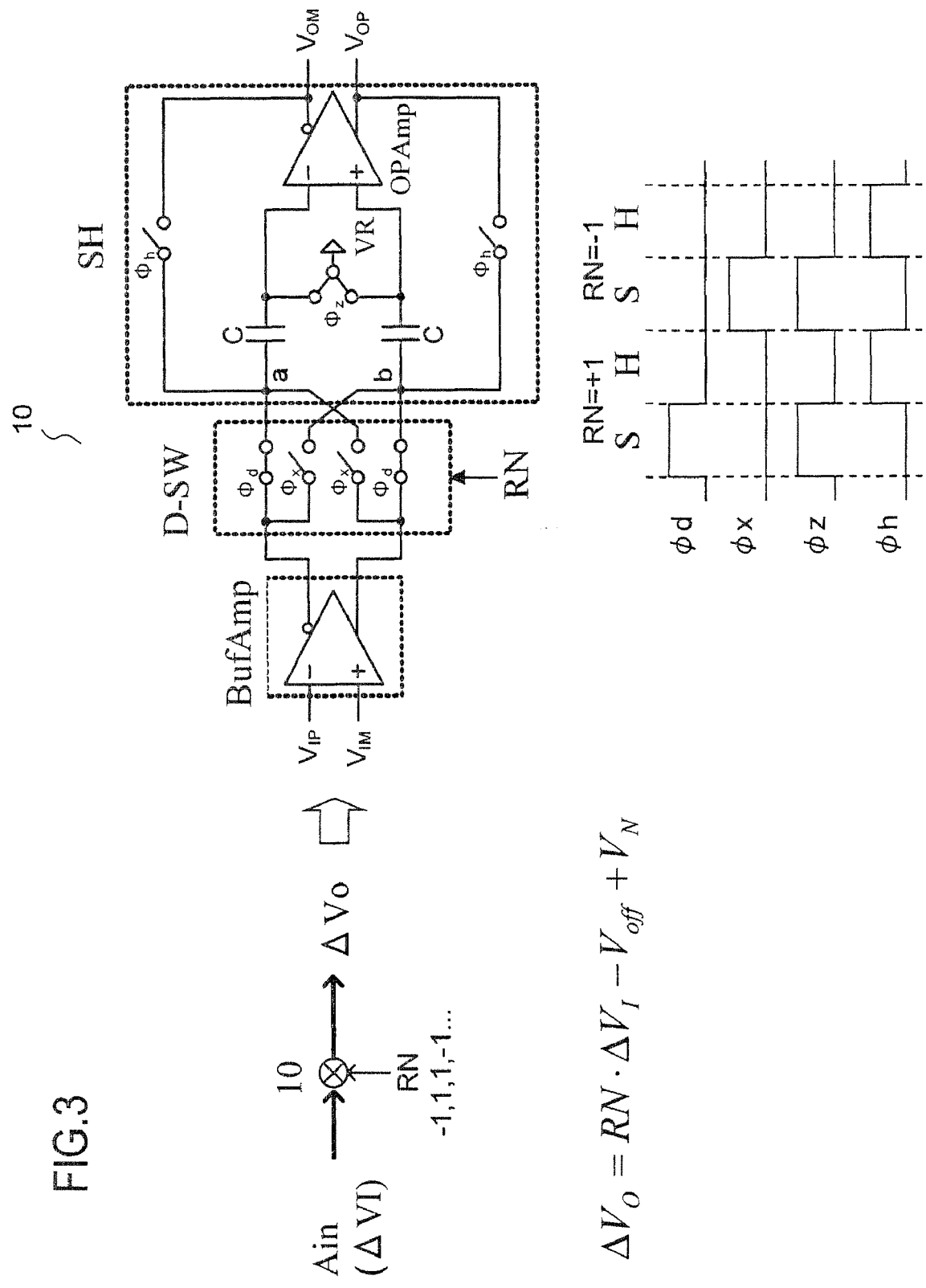
FIG. 3 is a drawing depicting the specific configuration of the spreading unit of FIG. 2.

FIG. 3 depicts the specific configuration of the spreading unit of FIG. 2. The ADC coupled to the latter stage of the spreading unit converts analog signals into digital signals, but requires a fixed amount of time for conversion processing. Hence the spreading unit 10 requires, in addition spreading processing based on random number signals RN, a sample-hold function to hold the analog signals after spreading processing.

The spreading unit 10 in FIG. 3 has a buffer amplifier BufAmp which takes as inputs the analog input signals as input differential signals VIP, VIM (where VIP is the positive input voltage and VIM is the negative input voltage), and outputs a differential voltage to an output terminal pair; a sample-hold circuit SH, which samples and holds the differential voltage; and a spreading switch D-SW, provided between these, which inverts or does not invert the differential voltage of the buffer amplifier output terminal pair according to the random number signals RN.

The spreading switch (or chopping switch) D-SW has a switch pair $\phi x$, coupled to the input terminal pair a, b of the sample-hold circuit SH, which inverts the outputs of the output terminal pair of the buffer amplifier BufAmp, and a non-inverting switch pair $\phi d$; one pair among the two switch pairs $\phi x$, $\phi d$ is conducting, and the other is nonconducting, based on the random number signals RN.

The sample-hold circuit SH has an operation amplifier OPAmp, a pair of capacitors C, a switch pair $\phi z$ which couple the capacitors C to a constant voltage VR during sampling, and a hold switch pair $\phi h$ which forms a feedback loop with the operational amplifier during holding.

As indicated by the operating waveforms of the four switch pairs $\phi d$, $\phi x$, $\phi z$, $\phi h$ in the figure, when the random number signal RN=+1, the non-inverting switch pair $\phi d$ is conducting, the inverting switch pair $\phi x$ is nonconducting, the switch pair $\phi z$ is conducting, and the hold switch pair $\phi h$ is nonconducting during the sampling interval S. By this means, the voltage across the output terminal pair of the buffer amplifier BufAmp is input to the input pair a, b of the sample-hold circuit SH, and the capacitor pair C is charged according to this input voltage. That is, the voltage corresponding to the analog input voltages VIP, VIM is sampled by the capacitor pair C. Next, during the hold interval H, the inverting switch pair φx becomes nonconducting, the non-inverting switch pair φd becomes nonconducting, the switch pair φz becomes nonconducting, and the hold switch pair φh becomes conducting. By this means, the operation amplifier output terminal pair VOM, VOP, which until this time had been at the similar potential, are fed back to the capacitor pair C, and the differential voltage sampled by the input terminal pair of the operation amplifier is applied. Hence the operation amplifier OPAmp drives the output terminal pair so as to assume the similar potential as the input terminal pair, and voltages corresponding to the analog input voltages VIM, VIP are output to the output terminal pair VOM, VOP.

On the other hand, when the random number signal RN=−1, the non-inverting switch pair φd and the inverting switch pair φx operate in the opposite manner, and so sampling operation and holding operation similar to those above are performed.

In this way, the spreading unit 10 spreads (or chops) the analog input voltages VIP, VIM based on the random number signals RN by means of the spreading switch D-SW, and may perform holding by means of the sample-hold circuit SH.

In the configuration of the spreading unit 10 of FIG. 3, the following offset component is included in the differential output voltage ΔVo which is held.

$$\Delta Vo = RN \cdot \Delta VI - Voff + VN$$

Here, ΔVI=VIP−VIM, ΔVo=VOP−VOM, RN is a pseudo-random number signal (+1, −1), Voff is the offset of the operational amplifier OPAmp, and VN is the current error due to scattering in the capacitors and switch. Hence by means of the background correction explained in FIG. 2, the DC component offset Voff and VN may be removed.

The spreading unit 10 in FIG. 3 transmits the analog input voltages VIP, VIM to the input pair a, b of the sample-hold circuit SH via the switches φd, φx, in order to perform spreading processing based on the random number signals RN. These switches φd, φx normally comprise MOS transistor switches or CMOS transistor switches; in this case the transistor turn-on resistance changes according to the level of the analog input voltage, so that the transistor delay characteristic changes, and distortion occurs in the analog input voltages passing through the switches.

Figure 4A:
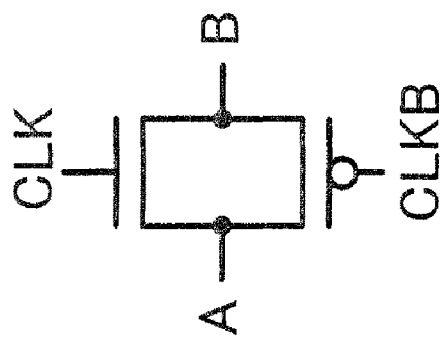
FIG. 4 is a drawing depicting an example of a MOS transistor switch.

FIG. 4 depicts an example of a MOS transistor switch. FIG. 4A is a switch comprising a MOS transistor; if the transistor is an N channel transistor, the transistor is conducting when the clock CLK input to the gate is at H level (normally the power supply voltage level Vdd), and the analog input signal at terminal A is transmitted to terminal B. In this case, a parasitic delay circuit comprising the turn-on resistance R of the MOS transistor and the parasitic capacitance Cp coupled to the terminal B is formed in the switch, and the analog input signal at terminal A is output from the terminal B delayed by the delay time of this delay circuit. Moreover, when the analog input signal to be processed by the sample-hold circuit is for example a sinusoidal signal or other signal the potential of which changes, when the signal level is low the turn-on resistance R is low and the delay time is short, but when the signal level is high the turn-on resistance B is increased, and the delay time is longer. Consequently the delay time due to the switch fluctuates according to the fluctuating analog input signal level, and distortion occurs in the analog signal output from terminal B. As a result, errors occur due to distortion in the level of signals which have been sampled and held, and this problem is addressed.

Figure 4B:
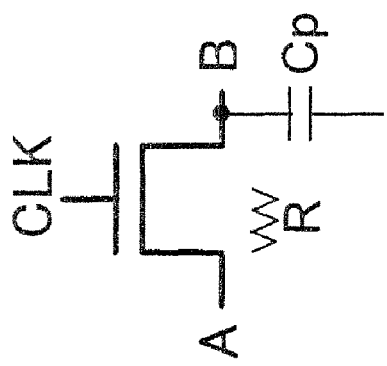

FIG. 4B is a switch comprising CMOS transistors; the switch is conducting and nonconducting according to the locks CLK, CLKB which are alternately inverted. In this switch comprising CMOS transistors also, similarly to the MOS transistor switch of FIG. 4A, distortion occurs in the analog signals output from the terminal B.

Figure 4C:
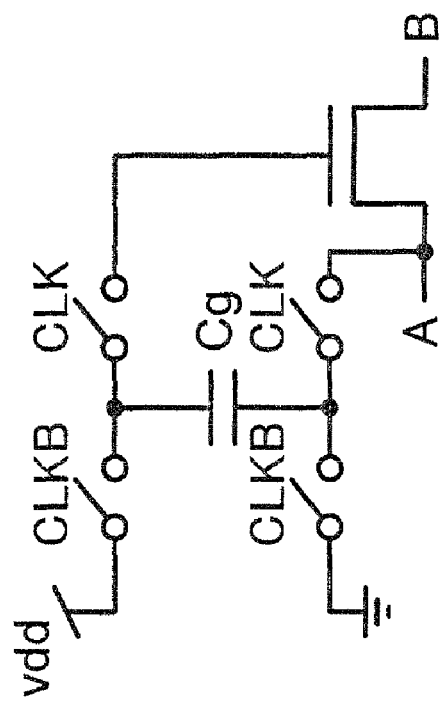

In order to eliminate the above distortion, the switch with a bootstrapping circuit in FIG. 4C is proposed. In this switch, when the inverted clock CLKB=H level the boot capacitor Cg is charged to the level of the power supply Vdd, and when the clock CLK=H level the boot capacitor Cg is coupled across the gate and drain of the MOS capacitor, the level fluctuation of the analog input signal at terminal A is also transmitted to the gate of the MOS transistor, and the turn-on resistance of the MOS transistor is held constant. By adopting the switch with a bootstrapping circuit, the occurrence of distortion due to the spreading switch D-SW of FIG. 3 may be suppressed.

However, if switches with bootstrapping circuits are adopted in the switch group of the spreading switch D-SW, there are the new problems of, first, an enlarged circuit scale, and second, an increase in the power consumption due to charging of the boot capacitors Cg. Hence adoption of such switches with bootstrapping circuits is not advantageous.

Spreading Unit of The Embodiment

FIG. 5 depicts the spreading unit circuit of this aspect and operation waveforms. This spreading unit 10 has a voltage-current converter VIcon, having a differential amplifier Amp1 which input analog input signals as differential voltage inputs VIP, VIM, and outputs an amplified differential current to the output terminal pair a1, b1; an integrator INT, comprising a capacitor pair Ca, Cb which are charged and discharged by the differential current, an operational amplifier OPAmp which is the output-side amplifier, and a reset switch pair φr; and, a spreading switch D-SW, provided therebetween, which inverts or does not invert the signals at the output terminal pair a1, b1 of the voltage-current converter VIcon according to random number signals RN, and couples the results to the input terminal pair a2, b2 of the integrator.

That is, the spreading unit in FIG. 5 is a sample-hold circuit with a spreading function which spreads the analog input signals using random number signals, and then samples and holds the analog input signals after spreading.

The voltage-current converter VIcon comprises for example a transconductance amplifier Amp1, and during sampling (or during tracking) causes the outflow or inflow from or to the output terminal pair a1, b1 of a current according to the difference in levels of the input differential voltages VIP, VIM. During holding, the hold switch φh is conducting, the output terminal pair a1, b1 is short-circuits or coupled to the same potential, and an output current path for the amplifier Amp1 is secured.

In the integrator INT, the sampled differential voltage is stored in and held by the capacitor pair Ca, Cb, and at the time of reset between the hold time and the sampling time the reset switches φr are made conducting and the capacitor pair Ca, Cb is short-circuited to perform reset. The spreading switch D-SW is the same as in FIG. 3.

Figure 5A:
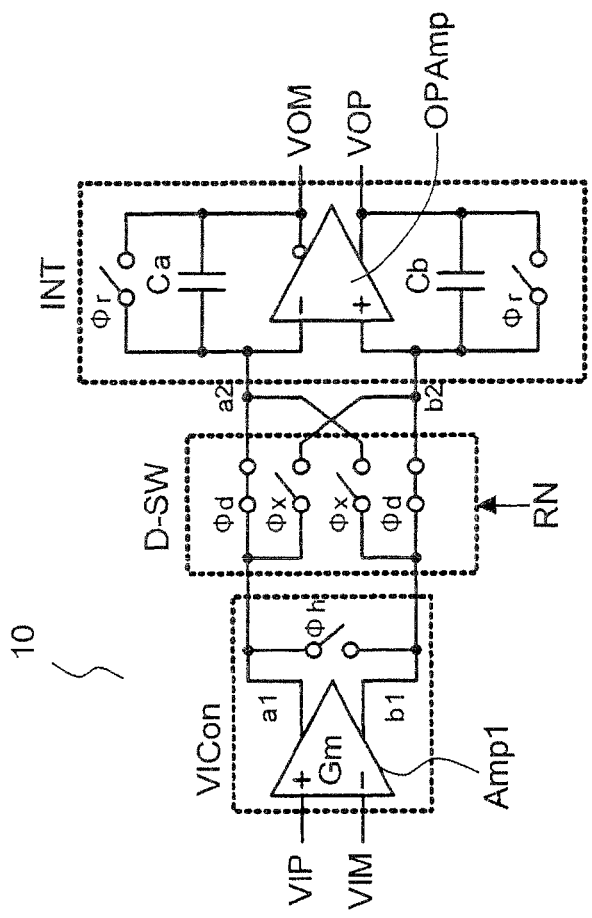
FIG. 5 is a drawing depicting the spreading unit circuit of this aspect and operation waveforms.

In the spreading unit 10 in FIG. 5A, the output terminal pair a1, b1 of the differential amplifier Amp1 comprised by the voltage-current converter VIcon are directly coupled to the input terminal pair a2, b2 of the operational amplifier OPAmp of the integrator INT, via either the non-inverting switch pair φd or the inverting switch pair φx of the spreading unit D-SW1. The input terminal pair a2, b2 of the operational amplifier OPAmp are part of negative feedback loops via the output terminal pair VOM, VOP and the capacitor pair Ca, Cb. That is, the capacitor pair Ca, Cb form negative-feedback circuits.

By means of this configuration, during sampling (or during tracking) the non-inverting switch pair φd of the spreading switch D-SW is conducting, and assuming that differential current is transmitted with a positive phase, current flows out for example from the output terminal a1 and current flows in from the output terminal b1 according to the level difference in the input differential voltages VIP, VIM. This outflowing current charges the capacitor Ca on the side of the input terminal a2 of the integrator, and the inflowing current discharges the capacitor Cb on the side of the input terminal b2 of the integrator. However, due to the negative-feedback circuits of the amplifier OPAmp in the integrator INT, the input terminal pair a2, b2 are virtual ground points, therefore the input terminal pair a2, b2 is maintained at the same potential. In other words, current flows from the negative output terminal VOM of the amplifier OPAmp to discharge the capacitor Ca, which is charged on the side of the input terminal a2, in order that the potential at the terminal a2 does not rise. On the other hand, current flows from the positive output terminal VOP of the amplifier OPAmp to charge the capacitor Cb, which is discharged on the side of the input terminal b2, in order that the potential at the terminal b2 does not fall. As a result, a differential voltage according to the differential current is output to the output terminal pair VOM, VOP of the amplifier OPAmp.

And, during holding the entirety of the switch group of the spreading switch D-SW is nonconducting, so that the differential current is shut off, and the differential voltages generated at the second input terminal pair a2, b2 at the end of sampling are maintained at the output terminal pair VOM, VOP of the integrator. And, during reset the reset switches φr are conducting, and the charges in the capacitor pair Ca, Cb are discharged to perform reset.

Figure 5B:
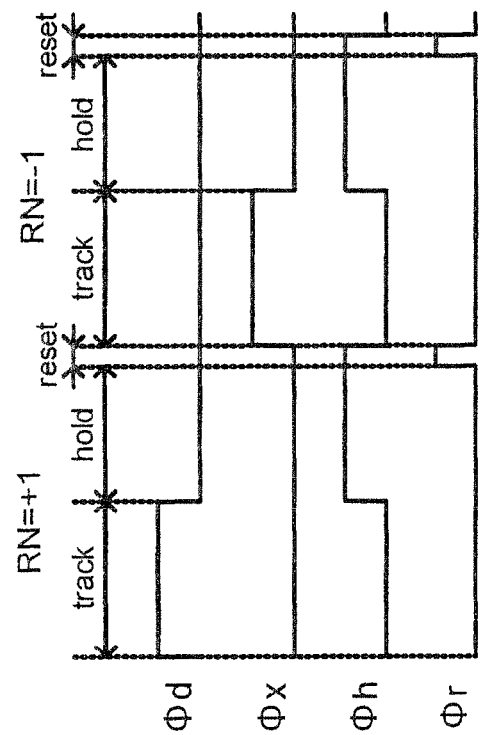

Operation is explained according to the control signal waveforms for the switches φd, φx, φh, φr in FIG. 5B. First, in the reset state the capacitor pair Ca, Cb is discharged, and the output terminal pair a1, b1 of the amplifier Amp1 is at the same level.

When the random number signal RN=+1, during sampling (or during tracking) the non-inverting switches φd are conducting, the inverting switches φx are nonconducting, and the hold switch φh and the reset switches φr are nonconducting. By this means, the spreading switch D-SW transmits the differential current of the output terminals a1, b1 of the voltage-current converter VIcon to the input terminal pair a2, b2 of the integrator INT with a positive phase. As explained above, through negative feedback to the amplifier OPAmp of the integrator INT, the input terminal pair a2, b2 become virtual ground points, and there is almost no fluctuation in potential. Hence there is no potential fluctuation at the terminals of the non-inverting switches φd of the spreading switch D-SW, and so signal distortion due to fluctuation of the turn-on resistance, and signal distortion due to injection charge error fluctuation during turn-off (fluctuations in injection charge due to the turn-off operation caused by a reduced gate voltage being fast or slow depending on the drain terminal potential), are suppressed.

Next, during holding, the switches φd, φx of the spreading switch D-SW are all nonconducting, and the integrator INT maintains the last state during sampling. During this holding, the ADC unit coupled to the next stage converts the differential output voltage of the differential outputs VOM, VOP into digital signals. During holding, the spreading switch D-SW is cut off, and so the switch φh short-circuits the differential output so that the differential outputs a1, b1 of the amplifier Amp1 do not saturate. And as explained below, the differential outputs a1, b1 may be coupled to terminals at the same potential.

After holding, the reset switches φr are conducting and the capacitors Ca, Cb of the integrator are discharged to perform reset. The reset switches φr in FIG. 5 short circuit the terminals of the capacitors Ca, Cb, but a configuration may be employed such that the reset switches φr couple the two terminals of the capacitors Ca, Cb to terminals at the same potential.

Next, when the random number signal RN=−1, during sampling (or during tracking) the inverting switches φx are conducting, the non-inverting switches φd are nonconducting, and the hold switch φh and reset switches φr are nonconducting. By this means, the spreading switch D-SW transmits the differential current of the output terminal pair a1, b1 of the voltage-current converter VIcon in reverse phase to the input terminal pair a2, b2 of the integrator INT. As explained above, through the negative feedback circuit of the amplifier OPAmp of the Integrator INT, the input terminal pair a2, b2 are virtual ground points, and the potential changes hardly at all. Hence signal distortion is prevented.

On the other hand, operation during holding and reset operation are the same as when the random number signal RN=+1.

Figure 6:
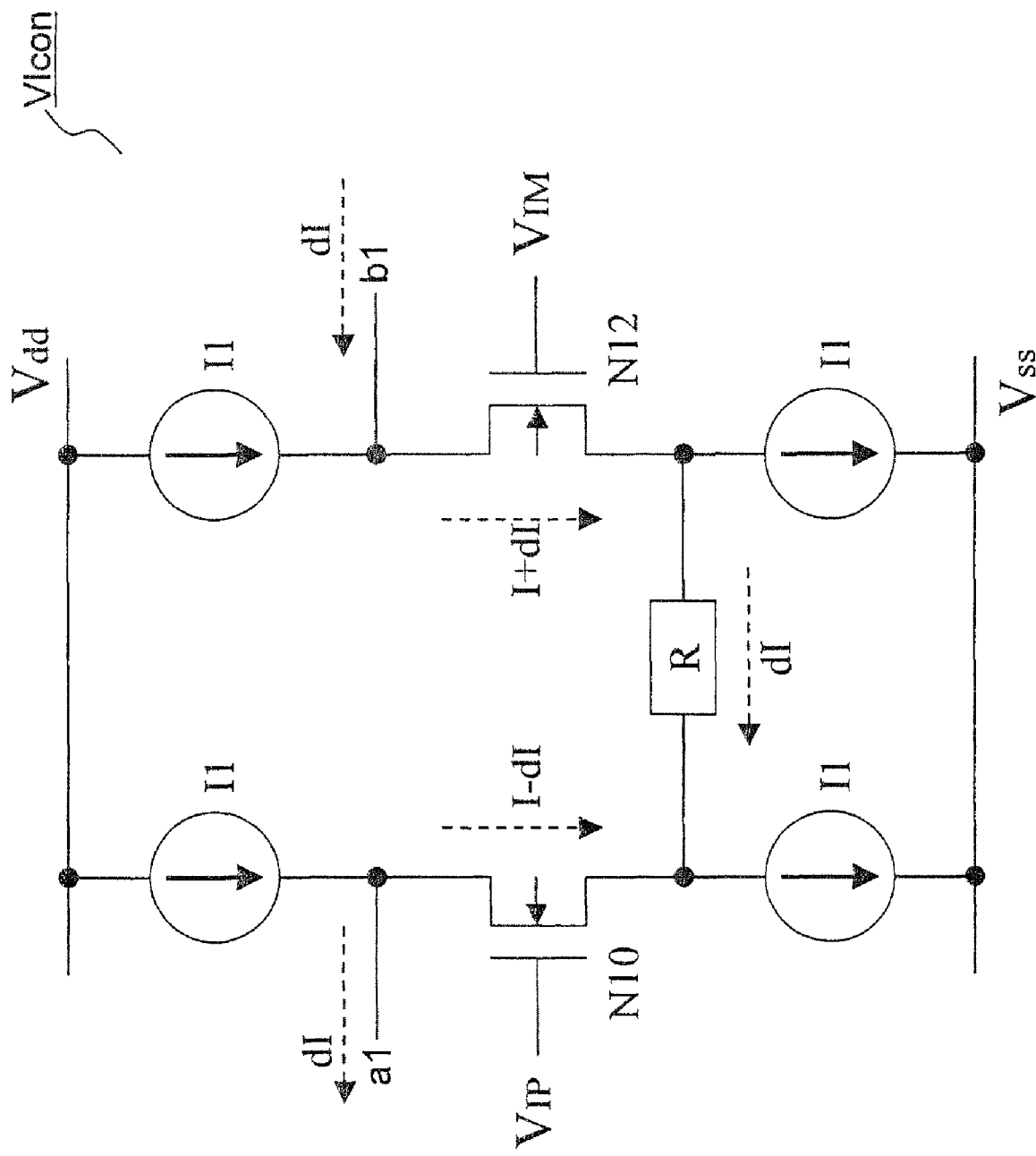
FIG. 6 is a specific circuit diagram of a voltage-current converter.

FIG. 6 is a specific circuit diagram of a voltage-current converter. The voltage-current converter VIcon is an amplifier having N-channel MOS transistors N10, N12, to the gates of which the analog input voltages VIP, VIm are applied, a constant-current source I1, and a resistance R. For example, when the analog input voltages are such that VIP<VIM, a current dI corresponding to this voltage difference flows out and in from and to the output terminal pair a1, b1, as depicted in the figure. Normally, the output load coupled to the output terminal pair a1, b1 is charged or discharged, and a prescribed differential voltage is output. However, in this embodiment the output terminal pair a1, b1 is coupled to the input terminal pair a2, b2 of the operational amplifier OPAmp of the integrator during sampling (tracking), so that even when the outflow and inflow of current dI occurs as above, there is no change in the potentials at the output terminal pair a1, b1.

Figure 7:
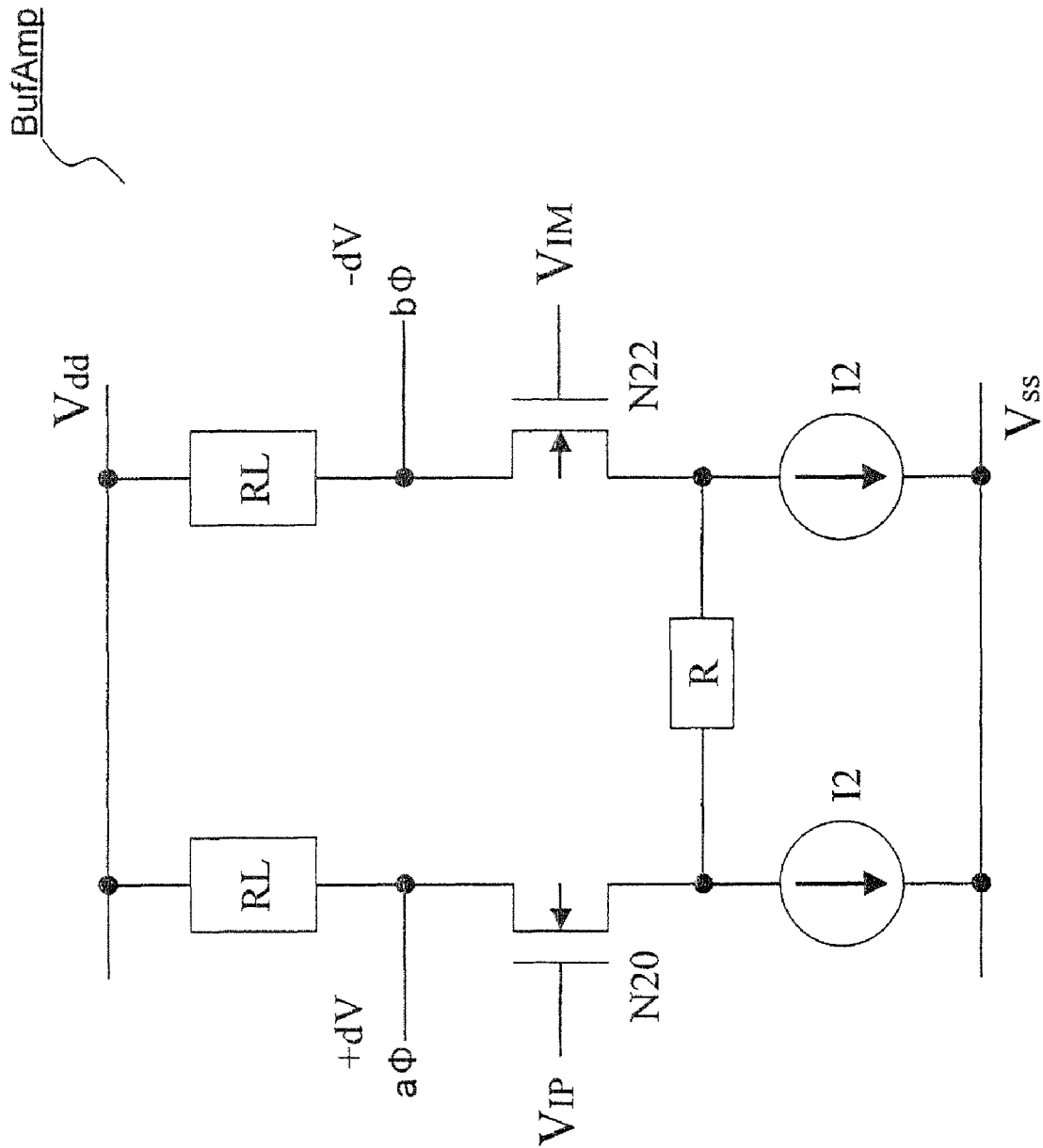
FIG. 7 is a specific circuit diagram for the buffer amplifier BufAmp of FIG. 3.

FIG. 7 is a specific circuit diagram for the buffer amplifier BufAmp of FIG. 3. This buffer amplifier is a circuit substantially equivalent to the voltage-current converter of FIG. 6, and has a load circuit pair RL, N-channel MOS transistors N20, N22 to the gates of which the analog input voltages VIP, VIM are applied, and a resistance R. When for example the analog input voltages are such that VIP<VIM, voltages +dV, −dV corresponding to the voltage difference appear at the output terminal pair a0, b0. The output terminal pair a0, b0 are coupled to the electrodes of one of the capacitors C of the sample-hold circuit SH, so that similarly to FIG. 6, the capacitor C is charged or discharged by current flowing out or in, and the voltages +dV, −dV appear.

Figure 8:
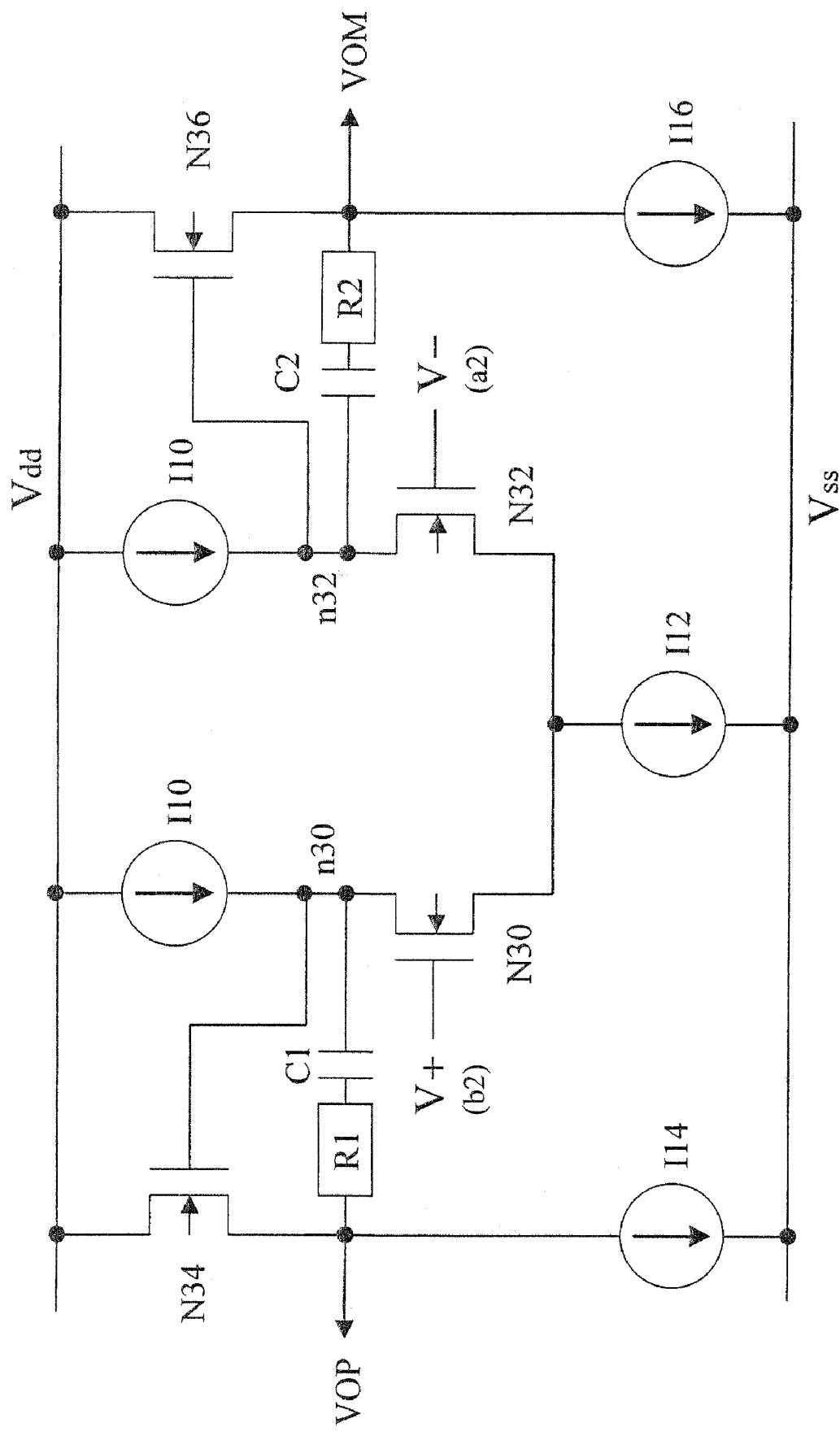
FIG. 8 is a specific circuit diagram for the operational amplifier of an integrator.

FIG. 8 is a specific circuit diagram for the operational amplifier of an integrator. This operational amplifier OPAmp has N-channel MOS transistors N30, N32, to the gates of which the differential voltages V+, V− are applied; current sources I10, I12; N-channel output transistors N34, N36, the gates of which are coupled to the drains n30, n32 of the transistors N30, N32; current sources I14, I16 coupled to these transistors; and circuits, comprising resistances R1, R2 and capacitors C1, C2, provided between the drains n30, n32 of the transistors N30, N32 and the sources of the output transistors N34, N36.

In this operational amplifier, the potentials at the drains n30, n32 rise and fall according to the potential difference of the differential voltages V+, V− applied to the gates of the input transistor pair N30, N32, and in response to the changes in potential of the drains n30, n32, the output transistors N34, N36 cause the potentials of the output voltages VOM, VOP to change. And, the output terminal VOM and input terminal a2, and VOP and b2 are coupled by the above-described negative-feedback circuits via the capacitors Ca, Cb. Hence the operational amplifier drives the output terminals VOP, VOM such that the potentials at the input terminals a2, b2 are equal.

Figure 9:
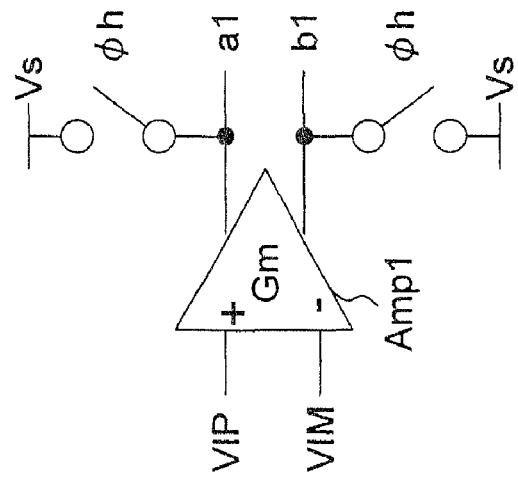
FIG. 9 is a drawing depicting a modified example of a voltage-current converter.

FIG. 9 depicts a modified example of a voltage-current converter. In this example, switches φh are provided which couple each terminal of the output terminal pair a1, b1 of the differential amplifier Amp1 to a constant voltage Vs during holding. That is, rather than short-circuiting the output terminal pair a1, b1, the terminals are coupled to a prescribed constant voltage Vs to reset the differential amplifier Amp1.

Figure 10:
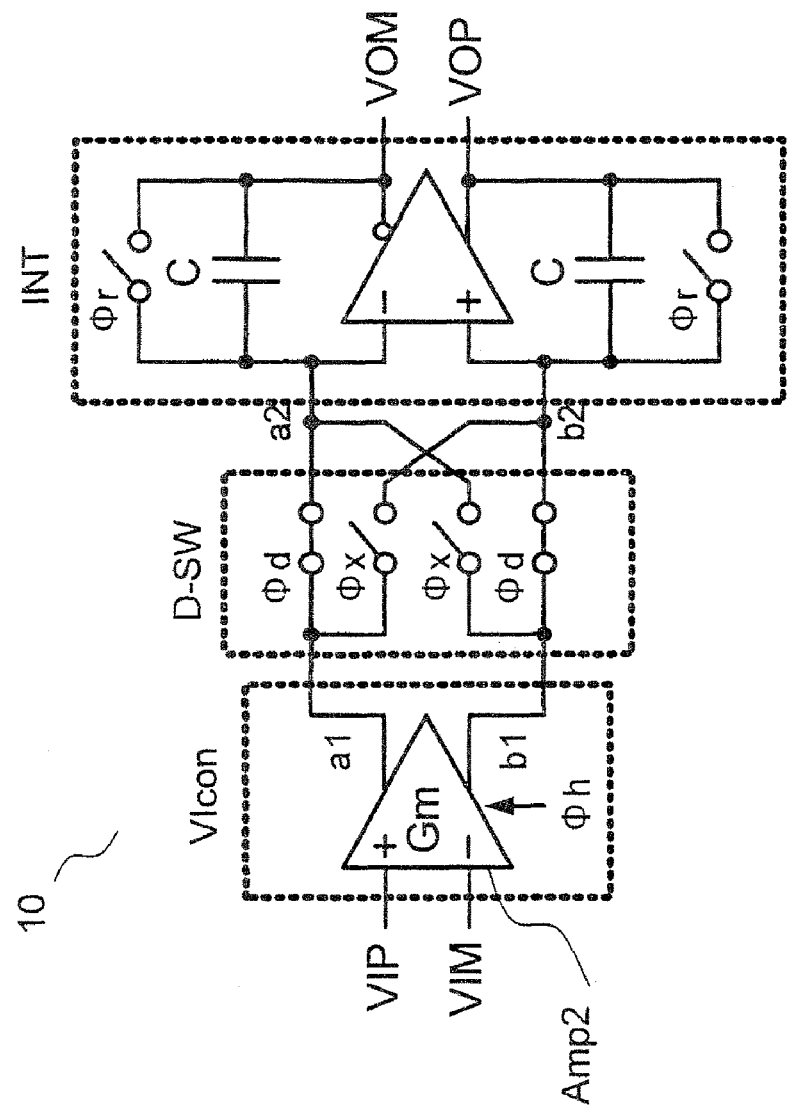
FIG. 10 is a drawing depicting a modified example of a voltage-current converter.

FIG. 10 depicts a modified example of a voltage-current converter. In FIG. 10, the configuration of the spreading unit 10 is depicted, but the spreading switch D-SW and integrator INT are the same as in FIG. 5, and the voltage-current converter differs from FIG. 5 in being a switched OTA (switched operational transconductance amplifier) Amp2. A switched OTA has a configuration which responds to φh during holding by cutting off the current source I1 in FIG. 6 from the output terminals a1, b1; by means of this cutting-off, the amplifier is reset.

Figure 11:
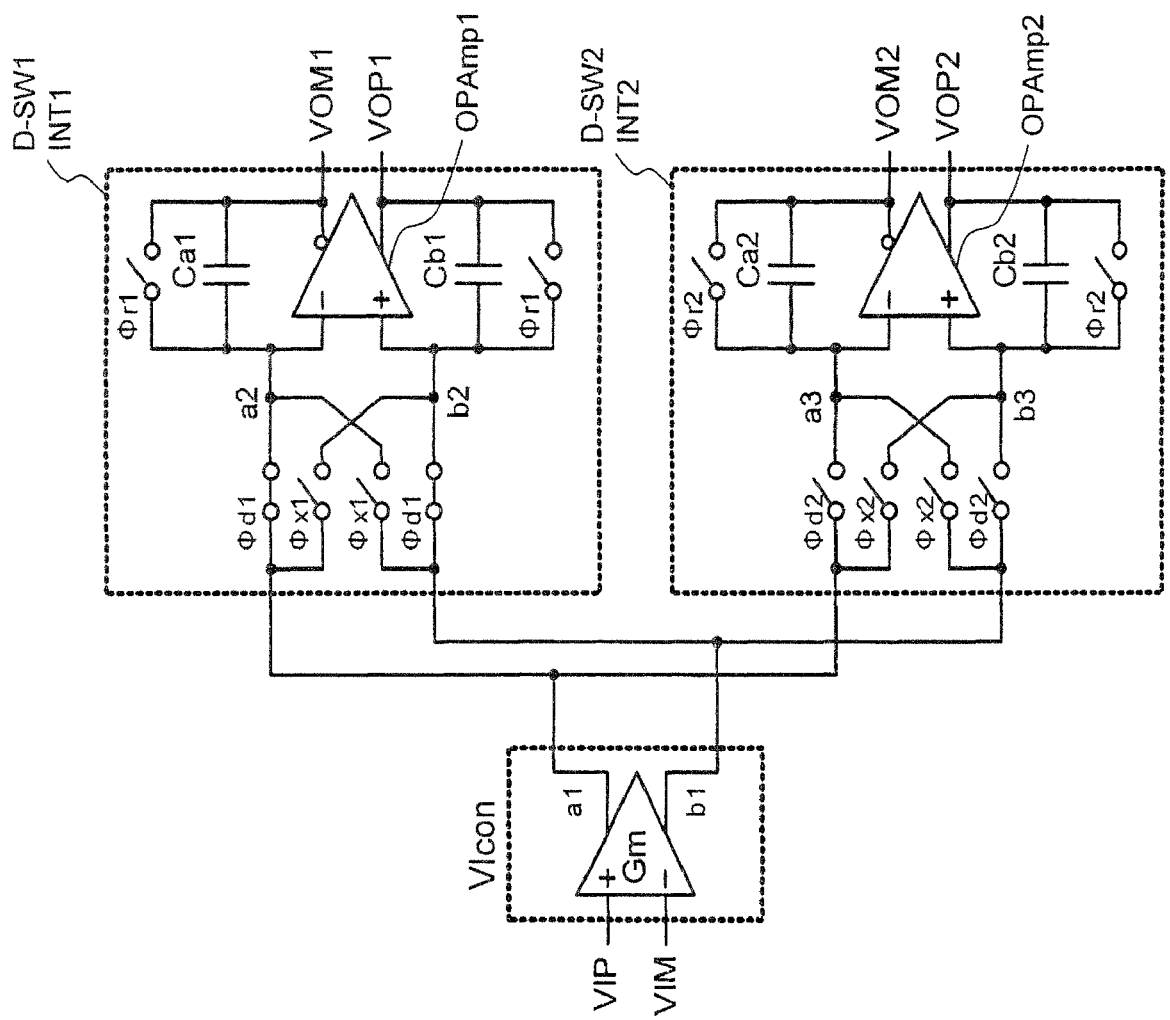
FIG. 11 is a drawing depicting another sample-hold circuit of this embodiment.

FIG. 11 depicts another sample-hold circuit of this embodiment. This sample-hold circuit is provided with a plurality of units D-SW1, INT1 and D-SW2, INT2 comprising a spreading switch and an integrator; in addition, these are provided in common with a current-voltage converter VIcon. Hence the output terminal pair a1, a2 of the current-voltage converter VIcon is coupled to the input terminal pairs a2, b2 and a3, b3 of the spreading switch-integrator units. Each of the circuit configurations is the same as in FIG. 5. While one unit is performing sampling operation (tracking operation), the other unit is performing holding operation, and while the other unit is performing sampling operation (tracking operation) the one unit is performing holding operation.

Figure 12:
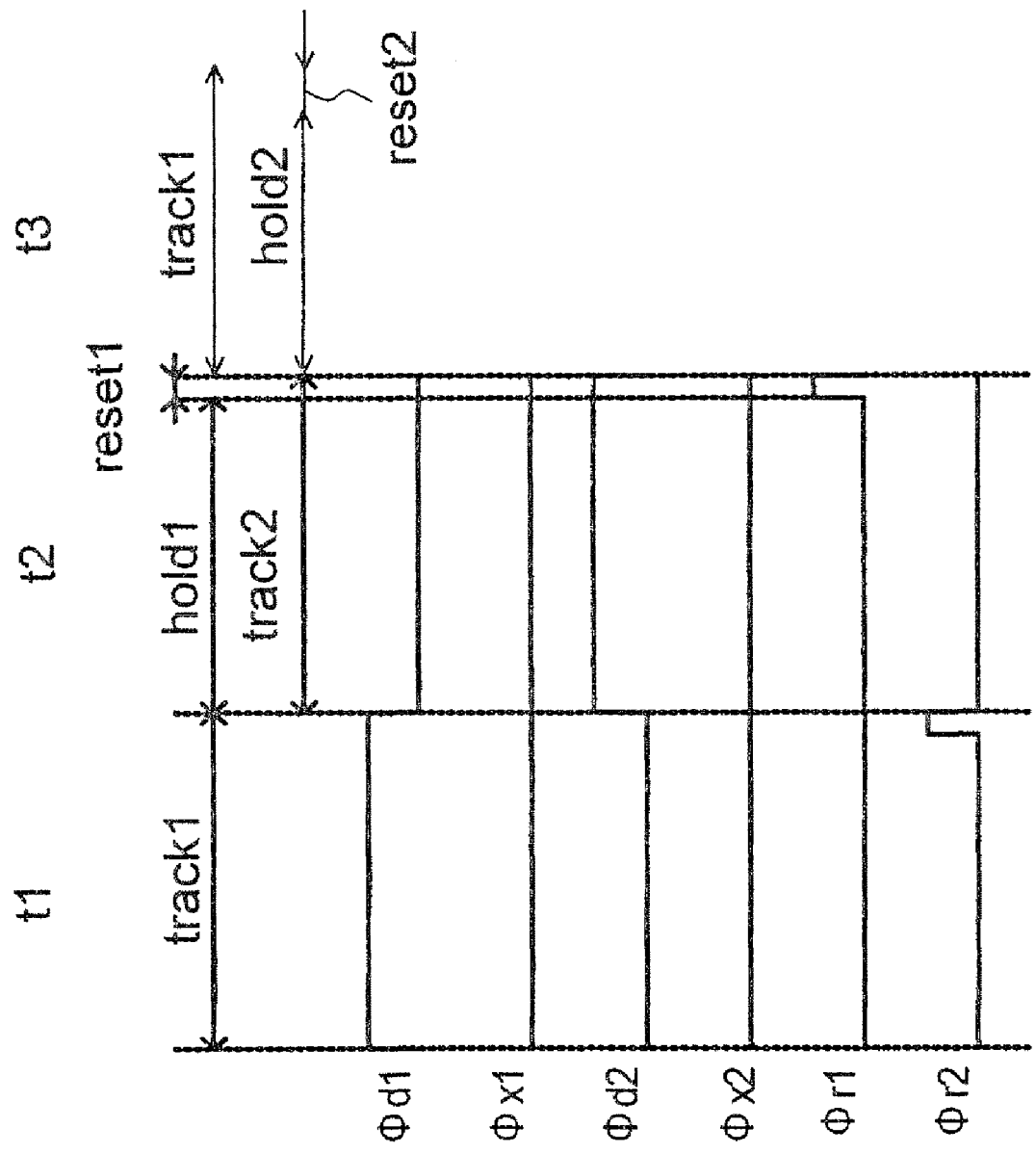
FIG. 12 is a drawing depicting the switch operation waveforms in the sample-hold circuit of FIG. 11.

FIG. 12 depicts the switch operation waveforms in the sample-hold circuit of FIG. 11. As depicted in the figure, in the interval t1 one of the units D-SW1, INT1 performs sampling operation (tracking operation), and in the next interval t2, one of the units D-SW1, INT1 performs holding operation, during which time the other unit D-SW1, INT2 performs sampling operation (tracking operation). And, in the next interval t3, one of the units D-SW1, INT1, after being reset, again performs sampling operation (tracking operation), and during this interval the other unit D-SW2, INT2 performs holding operation. At the time of transition from each holding operation to a sampling operation, the capacitors Ca1, Cb1, Ca2, Cb2 of the integrators are reset.

In this way, a plurality of units perform sampling operation (tracking operation) by time division, so that compared with FIG. 5, the sampling period may be shortened. Further, the voltage-current converter VIcon always outputs current to a unit performing a sampling operation, so that there is not absence of a current path during holding, as in FIG. 5. Hence there is no need for a switch across the output terminal pair of the input amplifier which conducts during holding.

In the example of FIG. 11, there are two spreading switches and integrators, so that sampling operations (tracking operations) are performed in two phases. When N units of spreading switches and integrators are provided, sampling operations are performed in N phases. And, after its own sampling operation, each unit holds the sampled level while other units are performing sampling operations.

Figure 13:
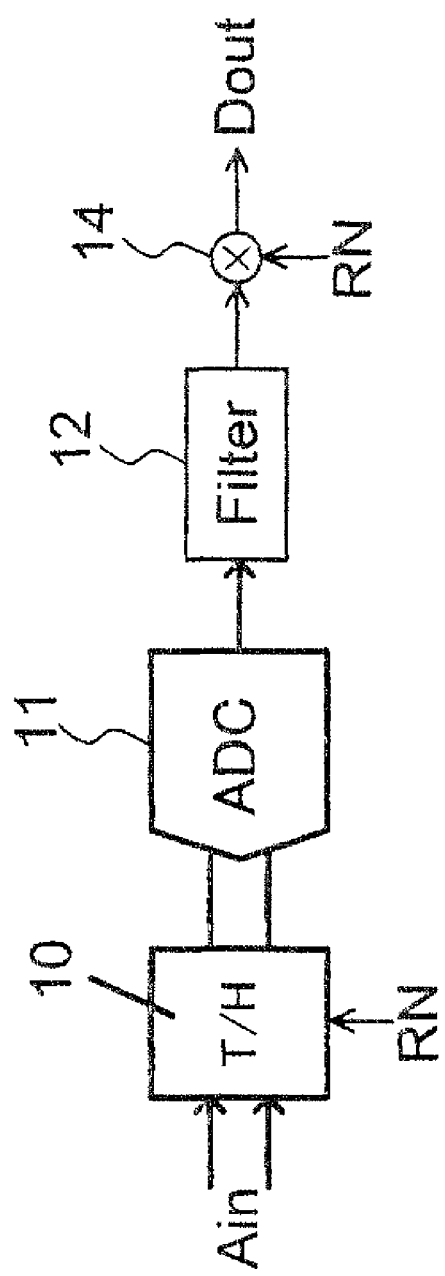
FIG. 13 is the circuit diagram of an analog-digital converter of an embodiment.

FIG. 13 is the circuit diagram of an analog-digital converter of an embodiment. This analog-digital converter circuit has a circuit 10 which performs spreading a differential analog input Ain by a random number signal RN and performs sampling and holding of the spread analog input, an ADC unit 11, a filter 12 which removes the DC component from the output, and a despreading unit 14 which multiplies the filter output by the random number signal to perform despreading. The sample-hold circuit 10 is the circuit in FIG. 5 and FIG. 10.

Operation of the sample-hold circuit 10 is as already explained above. The overall operation of the analog-digital converter circuit is the same as that explained using FIG. 2. That is, the sample-hold circuit 10 spreads the analog input Ain using a random number signal RN, the analog signal which was sampled and held is converted into a digital signal by the ADC unit 11, the filter 12 removes the DC component from the converted digital output of the ADC unit, and the despreading unit 14 uses the random number signal RN to perform despreading, so that the ADC circuit offset component may be removed in the background.

Figure 14A:
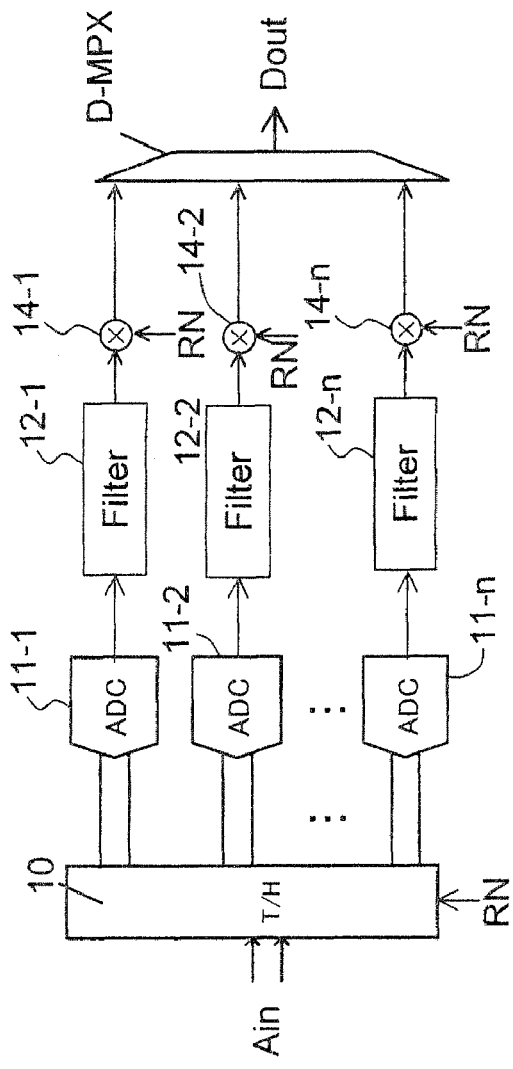
FIG. 14 is another analog-digital converter circuit of an embodiment.

FIG. 14 is another analog-digital converter circuit of an embodiment. In FIG. 14A are provided a sample-hold circuit 10, which is the sample-hold circuit explained using FIG. 11, having one voltage-current converter VIcon and n units with spreading switches and integrators; n ADC units 11-1 to 11-n, which perform analog-digital conversion of the outputs of each of the units of the sample-hold circuit 10; filters 12-1 to 12-n, which remove DC components; despreading units 14-1 to 14-n, which perform despreading using the random number signal RN; and, a multiplexer D-MPX which selects one among these outputs.

The sample-hold circuit 10 performs sampling operations (tracking operations) in N phases, and holds the analog voltage sampled in each phase. The ADC units 11-1 to 11-n perform analog-digital conversion of the respective held analog voltages. Hence operation of each of the ADC units is slow, and power consumption may be reduced.

Figure 14B:
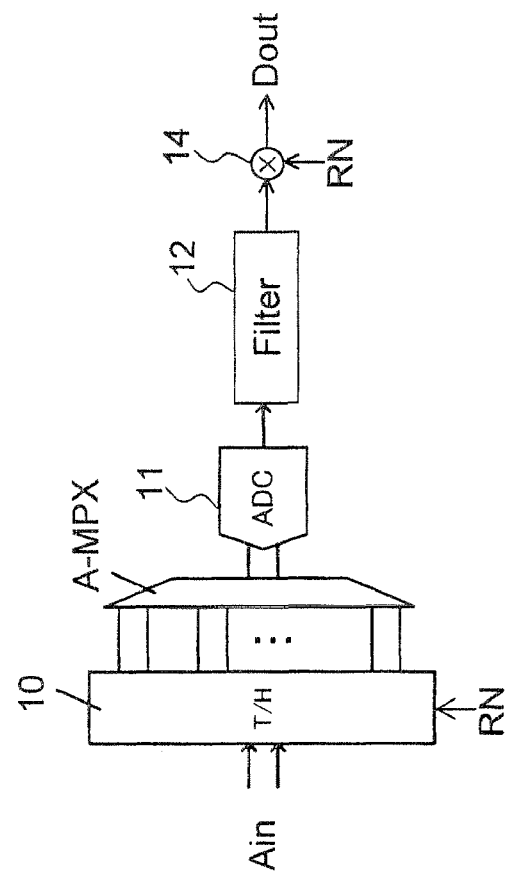

In the example of FIG. 14B, a multiplexer A-MPX which multiplexes the output of the sample-hold circuit 10 performing sampling in N phases, an ADC unit 11 provided in common, a filter 12 which removes the DC component, and a despreading unit 14 are provided. In this example, the ADC unit 11 performs conversion operation rapidly.

Figure 15:
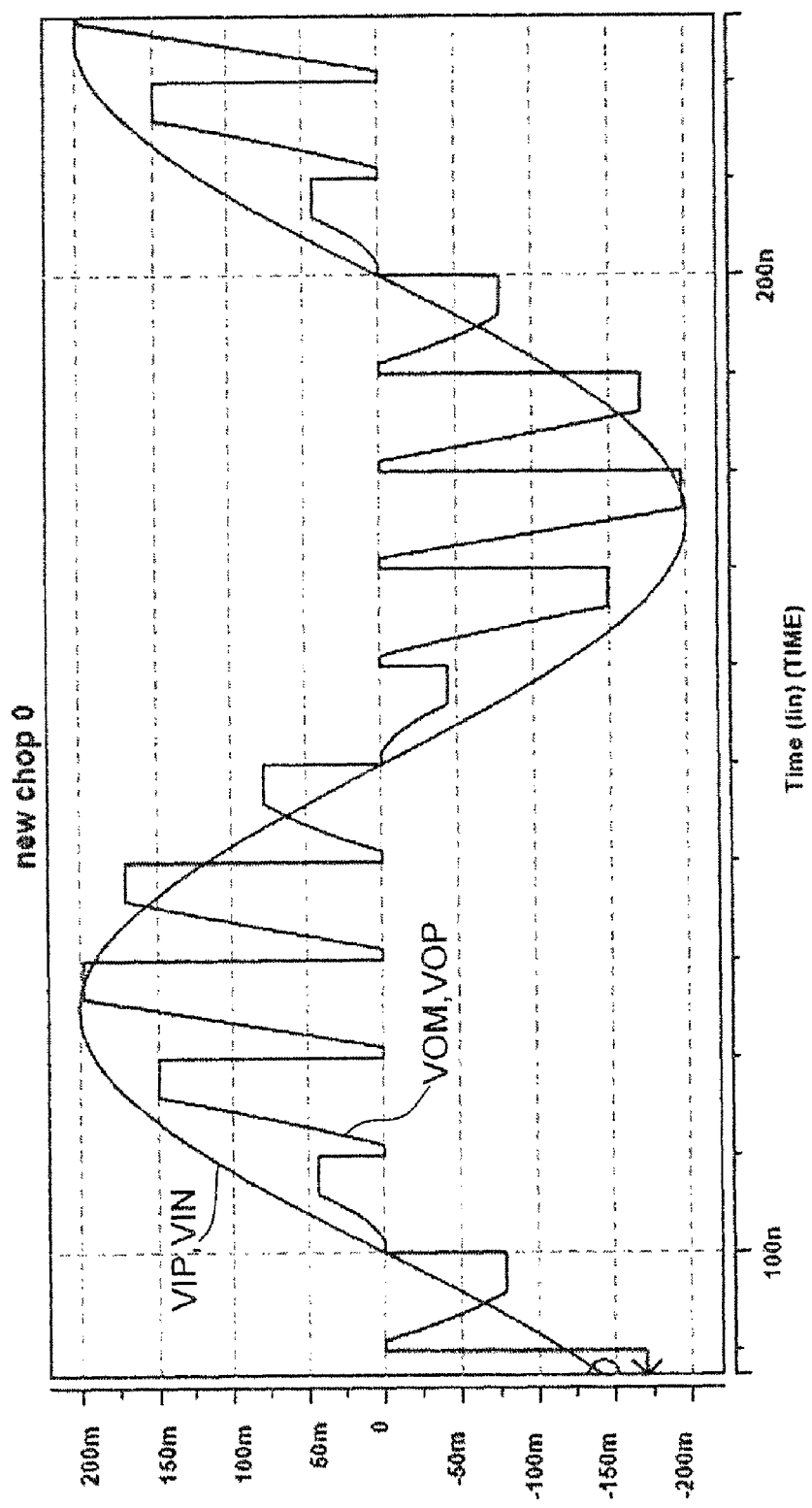
FIG. 15 is a drawing depicting simulation results of a sample-hold circuit of an embodiment.

FIG. 15 depicts simulation results of a sample-hold circuit of an embodiment. In the sample-hold circuit in FIG. 5, the analog outputs VOP, VOM are delayed relative to the analog inputs VIP, VIM and sampled-held. As explained in FIG. 5, in sampling operation (tracking operation) the analog outputs VOP, VOM are output delayed a prescribed time from the analog inputs VIP, VIM, and thereafter the levels are maintained in the hold operation. After each hold operation, the analog outputs VOP, VOM are reset, so that the differential output becomes zero.

Figure 16A:
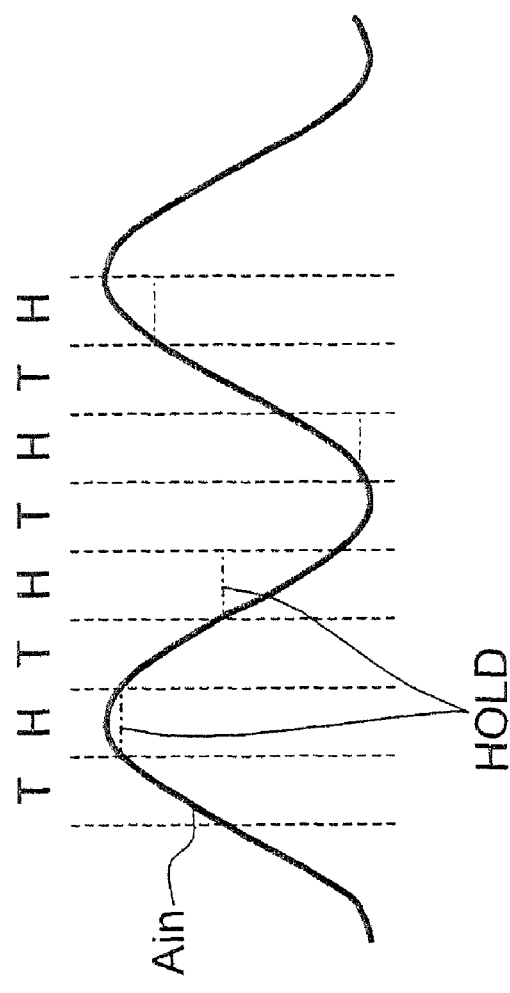
FIG. 16A is an example of the sample-hold circuit of FIG. 5

FIG. 16 explains differences in the sample-hold circuits of FIG. 5 and FIG. 11. FIG. 16A is an example of the sample-hold circuit of FIG. 5. As explained using FIG. 15 as well, the sample-hold circuit of FIG. 5 comprises one voltage-current converter, a spreading unit, and an integrator, so that sampling operations (tracking operations) and holding operations are performed in series. Hence for the analog input Ain, the analog signal HOLD being held is indicated by a dot-dash line, and the sampling rate is reduced.

Figure 16B:
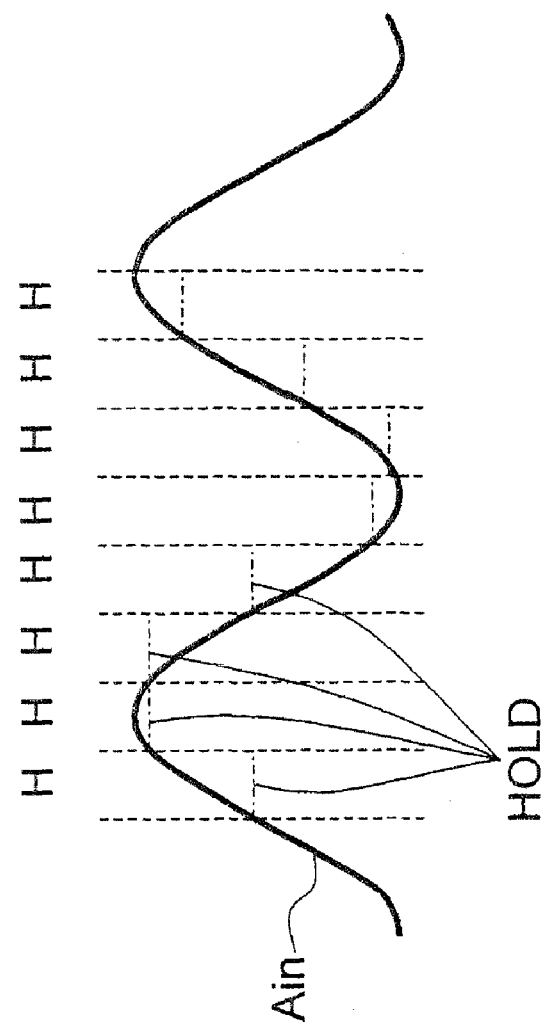
FIG. 16B is an example of thee sample-hold circuit of FIG. 11.

On the other hand, FIG. 16B is an example of the sample-hold circuit of FIG. 11. In the case of FIG. 11, a plurality of spreading units and integrator units are provided, and sampling operations are performed in two phases, so that all intervals are hold intervals; the held analog signal HOLD is indicated by a dot-dash line, and the sampling rate is twice that of FIG. 16A.

According to any one of aforementioned embodiments, a sample-hold circuit has a spreading switch capable of sample-hold operation without causing distortion in analog signals.

The invention claimed is:

1. A sample-hold circuit comprising:
a voltage-current converter, having a first input terminal pair to which an input differential signal is input and a first output terminal pair which outputs current according to the voltage of the input differential signal;
a spreading switch having a switch group which switches the first output terminal pair to inverting or non-inverting states; and
an integrator having a second input terminal pair coupled to the first output terminal pair via the spreading switch, an output amplifier which outputs to a second output terminal pair an output differential signal amplified according to the differential signal at the second input terminal pair, a capacitor pair which is provided respectively between the second input terminal pair and second output terminal pair, and which is charged or discharged by current input to the second input terminal pair, and a reset circuit which resets charge states of the capacitor pair,
wherein the spreading switch is capable of switching to a cutoff state in addition to the inverting and non-inverting states, the spreading switch enters the non-inverting state or inverting state during sampling intervals and the capacitor pair of the integrator is charged or discharged respectively by the input current, the spreading switch enters the cutoff state during a hold interval after the sampling interval, and the output differential signal at the second output terminal pair is held by the integrator, and upon a transition from the hold interval to a sampling interval the reset circuit resets the charge state of the capacitor pair.

2. The sample-hold circuit according to claim 1, wherein the voltage-current converter has a short circuit which short-circuits the first output terminal pair during the hold interval.

3. The sample-hold circuit according to claim 1, wherein the voltage-current converter halts the output of the current at the first output terminal pair during the hold interval.

4. The sample-hold circuit according to claim 1, wherein
the switch group of the spreading switch has a non-inverting switch pair which couples the first output terminal pair and the second input terminal pair without inversion, and an inverting switch pair which couples the first output terminal pair and the second input terminal pair with inversion, and
in the non-inverting state the non-inverting switch pair is conducting and the inverting switch pair is nonconducting, in the inverting state the non-inverting switch pair is nonconducting and the inverting switch pair is conducting, and in the cutoff state the non-inverting switch pair and inverting switch pair are both nonconducting.

5. The sample-hold circuit according to claim 1, wherein
a plurality of units having the spreading switch and integrator are provided,
the voltage-current converter is provided in common for the plurality of units,
sampling intervals of the plurality of units are allocated in order by time division, and each unit performs the hold interval operation after the allocated sampling interval.

6. An analog-digital converter, comprising:
the sample-hold circuit according to claim 1, the spreading switch being switched between the inverting switching state and non-inverting switching state by a random number signal;
an analog-digital converter which converts the output differential signal at the second output terminal pair of the integrator during the hold interval into digital signals;
a filter which removes a DC component from the output of the analog-digital converter; and
a despreading unit which multiplies the output of the filter by the random number signal.

7. The analog-digital converter according to claim 6, wherein
the spreading switch is capable of switching to a cutoff state in addition to the inverting and non-inverting states,
the spreading switch enters the non-inverting state or inverting state during sampling intervals and the integrator capacitor pair is charged or discharged respectively by the input current,
the spreading switch enters the cutoff state during a hold interval after the sampling interval and the output differential signal at the second output terminal pair is held by the integrator, and
upon a transition from the hold interval to a sampling interval, the reset circuit resets the charge state of the capacitor pair.

8. An analog-digital converter, comprising:
the sample-hold circuit according to claim 5, in which spreading switches of each of the unit switch between inverting and non-inverting states according to a random number signal;
a plurality of analog-digital converters, which convert output differential signals, being output at the second output terminal pairs of the integrator of the plurality of units during a hold interval, into digital signals;
a filter which removes DC components from the output of the analog-digital converters; and
a despreading unit which multiplies the output of the filter by the random number signal.

9. The analog-digital converter according to claim 6, comprising a multiplexer which selects digital signals output from a plurality of analog-digital converters in the order and outputs the signals to the filter, wherein the filter and despreading unit are provided in common to the plurality of analog-digital converters.

10. A sample-hold circuit which samples and holds an input differential signal and outputs an output differential signal, comprising:
an input amplifier circuit having a first input terminal pair to which the input differential signal is input and a first output terminal pair which outputs an amplified differential signal;
a spreading switch having a switch group which switches the first output terminal pair to inverting or non-inverting states; and
an integrator having a second input terminal pair coupled to the first output terminal pair via the spreading switch, an output amplifier which outputs to a second output terminal pair the output differential signal amplified according to the differential signal at the second input terminal pair, a negative-feedback circuit having a capacitor pair provided respectively between the second input terminal pair and second output terminal pair, and a reset circuit which resets charge states of the capacitor pair, wherein the spreading switch is capable of switching to a cutoff state in addition to the inverting and non-inverting states, the spreading switch enters the non-inverting state or inverting state during sampling intervals and the integrator capacitor pair is charged or discharged respectively by the currents of the first output terminal pair, the spreading switch enters the cutoff state during a hold interval after the sampling interval and the output differential signal at the second output terminal pair is held by the integrator, and upon a transition from the hold interval to a sampling interval, the reset circuit resets the charge state of the capacitor pair.

11. The sample-hold circuit according to claim 10, wherein the input amplifier circuit is provided, in common, with N units having the spreading switch and integrator, and the N units perform sampling operations in order in N phase.

12. An analog-digital converter, comprising:
the sample-hold circuit according to claim 11, in which the spreading switches of each of the units switch between the inverting and non-inverting states according to a random number signal;
N units of analog-digital converters, which convert the output differential signals, being output at the second output terminal pairs of the integrator of the N units during the hold interval, into digital signals;
a filter which removes DC components from the output of the analog-digital converters; and
a despreading unit which multiplies the output of the filter by the random number signal.

* * * * *